United States Patent
Huang et al.

(10) Patent No.: US 10,396,213 B2
(45) Date of Patent: Aug. 27, 2019

(54) ACTIVE DEVICE ARRAY SUBSTRATE AND MANUFACTURING METHOD THEREOF

(71) Applicant: Chunghwa Picture Tubes, LTD., Taoyuan (TW)

(72) Inventors: Chin-Hai Huang, Taoyuan (TW);
Ya-Ju Lu, New Taipei (TW);
Shang-Jung Yang, Taichung (TW);
Yen-Yu Huang, Taoyuan (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 8 days.

(21) Appl. No.: 15/853,984

(22) Filed: Dec. 26, 2017

(65) Prior Publication Data

US 2019/0131460 A1    May 2, 2019

(30) Foreign Application Priority Data

Nov. 2, 2017    (CN) .......................... 2017 1 1061650

(51) Int. Cl.
*H01L 29/10*    (2006.01)
*H01L 29/12*    (2006.01)
(Continued)

(52) U.S. Cl.
CPC ...... *H01L 29/78696* (2013.01); *H01L 27/127* (2013.01); *H01L 27/1233* (2013.01);
(Continued)

(58) Field of Classification Search
CPC ............... H01L 27/1251; H01L 27/124; H01L 27/1214; H01L 27/3262; H01L 27/1237;
(Continued)

(56) References Cited

U.S. PATENT DOCUMENTS

| | | | | |
|---|---|---|---|---|
| 2010/0148168 | A1* | 6/2010 | Lai | ...................... H01L 27/1225 257/43 |
| 2011/0031496 | A1* | 2/2011 | Yamazaki | ........... H01L 27/1225 257/59 |
| 2018/0226512 | A1* | 8/2018 | Nakano | ............... H01L 29/7869 |

FOREIGN PATENT DOCUMENTS

| | | |
|---|---|---|
| CN | 106229297 | 12/2016 |
| CN | 106558594 | 4/2017 |
| TW | I476931 | 3/2015 |

* cited by examiner

*Primary Examiner* — Mohammed Shamsuzzaman
*Assistant Examiner* — Aaron J Gray
(74) *Attorney, Agent, or Firm* — JCIPRNET (57) ABSTRACT

An active device array substrate includes a substrate, first and second active devices, a gate insulation layer and an insulation barrier layer. The first and second active devices respectively includes first and second gate electrodes, first and second semiconductor blocks, first and second source electrodes, and first and second drain electrodes. A film layer of the second source electrode and the second drain electrode is the same with that of the first source electrode or the first drain electrode. The gate insulation layer is located between the first gate electrode and the first semiconductor block and between the second gate electrode and the second semiconductor block. The insulation barrier layer is disposed on the gate insulation layer, and covers the first semiconductor block. The insulation barrier layer has a first through hole for one of the first source electrode and the first drain electrode contacting the first semiconductor block.

14 Claims, 8 Drawing Sheets

(51) Int. Cl.
*H01L 29/04* (2006.01)
*H01L 27/14* (2006.01)
*H01L 29/15* (2006.01)
*H01L 29/786* (2006.01)
*H01L 27/12* (2006.01)
*H01L 29/49* (2006.01)
*H01L 29/417* (2006.01)

(52) U.S. Cl.
CPC ...... *H01L 27/1237* (2013.01); *H01L 27/1248* (2013.01); *H01L 27/1251* (2013.01); *H01L 29/41733* (2013.01); *H01L 29/4908* (2013.01)

(58) Field of Classification Search
CPC ............. H01L 27/1233; H01L 27/1229; H01L 29/78696
USPC .............................. 257/59, 43, 258; 438/149
See application file for complete search history.

ACTIVE DEVICE ARRAY SUBSTRATE AND MANUFACTURING METHOD THEREOF

CROSS-REFERENCE TO RELATED APPLICATION

This application claims the priority benefit of China application serial no. 201711061650.7, filed on Nov. 2, 2017. The entirety of the above-mentioned patent application is hereby incorporated by reference herein and made a part of this specification.

BACKGROUND OF THE INVENTION

Field of the Invention

The invention relates to a device array and a manufacturing method thereof, and particularly relates to an active device array substrate and a manufacturing method thereof.

Description of Related Art

Display panels have widely applied thin-film transistors to serve as active devices in pixel structures. Along with the development of display panel, besides that the thin-film transistors are configured as the active devices in the pixel structures, the thin-film transistors may also be used to construct a driving circuit of the display panel. For example, a gate driving circuit integrated on a substrate may be constructed by using the thin-film transistors. However, the active devices applied to the pixel structures have different requirements on characteristics of the thin-film transistors compared with the thin-film transistors applied to the gate driving circuit. Taking an organic light-emitting diode (OLED) display panel as an example, the OLED pixel of the current driving type usually has a higher requirement on performance of the active device. Therefore, a thin-film transistor structure with higher stability is required. However, a driving circuit of the OLED is required to be implemented by a plurality of active devices. Therefore, the OLED display panel is probably limited by a structure design of the driving circuit and cannot achieve a higher resolution.

SUMMARY OF THE INVENTION

The invention is directed to an active device array substrate, which may adopt active devices of different structures to meet different circuit requirements, so as to improve a performance of the active device array substrate.

The invention is directed to a manufacturing method of an active device array substrate, by which active devices of different structures are fabricated on a same substrate without adopting complicated steps.

An embodiment of the invention provides an active device array substrate including a substrate, a first active device, a second active device, a gate insulation layer and an insulation barrier layer. The first active device is disposed on the substrate and has a first gate electrode, a first semiconductor block, a first source electrode and a first drain electrode. The first source electrode and the first drain electrode contact the first semiconductor block and separate from each other. The second active device is disposed on the substrate and includes a second gate electrode, a second semiconductor block, a second source electrode and a second drain electrode. The second source electrode and the second drain electrode contact the second semiconductor block and separate from each other. A film layer of the second source electrode and the second drain electrode is the same with that of the first source electrode or the first drain electrode. The gate insulation layer is disposed on the substrate. The first gate electrode and the second gate electrode are located between the gate insulation layer and the substrate. The gate insulation layer is located between the first gate electrode and the first semiconductor block and is also located between the second gate electrode and the second semiconductor block. The insulation barrier layer is disposed on the gate insulation layer, and covers the first semiconductor block. The insulation barrier layer has a first through hole, wherein the insulation barrier layer is disposed between the first source electrode and the first drain electrode, and one of the first source electrode and the first drain electrode contacts the first semiconductor block through the first through hole.

In an embodiment of the invention, the insulation barrier layer does not cover the second semiconductor block, the second source electrode and the second rain electrode.

In an embodiment of the invention, the active device array substrate further includes a third active device. The third active device is disposed on the substrate and includes a third gate electrode, a third semiconductor block, a third source electrode and a third drain electrode. The gate insulation layer is located between the third gate electrode and the third semiconductor block. The third source electrode and the third drain electrode contact the third semiconductor block and separate from each other. A film layer of the third source electrode and the third drain electrode is the same with that of the first source electrode or the first drain electrode.

In an embodiment of the invention, the insulation barrier layer further covers the third semiconductor block. The insulation barrier layer has a second through hole and a third through hole. The third source electrode and the third drain electrode are disposed on an upper surface of the insulation barrier layer, wherein the upper surface is away from the substrate, and the third source electrode and the third drain electrode respectively contact the third semiconductor block through the second through hole and the third through hole.

In an embodiment of the invention, the insulation barrier layer further covers the second semiconductor block, and has a second through hole and a third through hole. The second source electrode and the second drain electrode are disposed on an upper surface of the insulation barrier layer, wherein the upper surface is away from the substrate, and the second source electrode and the second drain electrode respectively contact the second semiconductor block through the second through hole and the third through hole.

In an embodiment of the invention, one of the first source electrode and the first drain electrode is connected to one of the second gate electrode, the second source electrode and the second drain electrode, or the first gate electrode is connected to one of the second source electrode and the second drain electrode.

In an embodiment of the invention, a material of the first semiconductor block and the second semiconductor block includes an oxide semiconductor material.

In an embodiment of the invention, the first source electrode and the first drain electrode contact different surfaces of the first semiconductor block.

In an embodiment of the invention, the first source electrode and the first drain electrode contact a same surface of the first semiconductor block.

In an embodiment of the invention, the active device array substrate further includes a plurality of pixel electrodes. The pixel electrodes are arranged in a display area in an array. One of the first active device and the second active device is disposed in the display area and is connected to one of the pixel electrodes, and the other one is disposed in a peripheral area, and the peripheral area is located at a periphery of the display area.

An embodiment of the invention provides a manufacturing method of an active device array substrate, which includes following steps. A first gate electrode, a second gate electrode, a third gate electrode and a gate insulation layer are fabricated on a substrate, wherein the gate insulation layer covers the first gate electrode, the second gate electrode and the third gate electrode. A first semiconductor block, a second semiconductor block and a third semiconductor block are formed on the gate insulation layer. A position of the first semiconductor block corresponds to the first gate electrode, a position of the second semiconductor block corresponds to the second gate electrode, and a position of the third semiconductor block corresponds to the third gate electrode. A first source electrode is formed on the gate insulation layer, wherein the first source electrode contacts the first semiconductor block. An insulation barrier layer is formed on the gate insulation layer, wherein the insulation barrier layer covers the first source electrode, and is patterned to have a first through hole, a second through hole, a third through hole and an opening. The first through hole exposes the first semiconductor block, the second through hole and the third through hole expose two parts of the third semiconductor block, and the opening completely exposes the second semiconductor block. A first drain electrode, a second source electrode, a second drain electrode, a third source electrode and a third drain electrode are formed. The first drain electrode is filled in the first through hole, and the third source electrode and the third drain electrode are filled in the second through hole and the third through hole. The second source electrode and the second drain electrode are formed on the second semiconductor block exposed by the opening.

In an embodiment of the invention, the first drain electrode, the second source electrode, the second drain electrode, the third source electrode and the third drain electrode are formed by patterning a same conductive material layer.

In an embodiment of the invention, after the first source electrode is formed, the first semiconductor block is formed on the gate insulation layer.

In an embodiment of the invention, before the first source electrode is formed, the first semiconductor block is formed on the gate insulation layer.

In an embodiment of the invention, the first semiconductor block, the second semiconductor block and the third semiconductor block are formed by patterning a same semiconductor material layer.

According to the above description, in the manufacturing method of the active device array substrate, the active devices with different structures can be fabricated on the same substrate without implementing complicated steps, and a designer may select different active devices according to different requirements, by which design flexibility is improved and optimization of the active device array substrate is achieved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
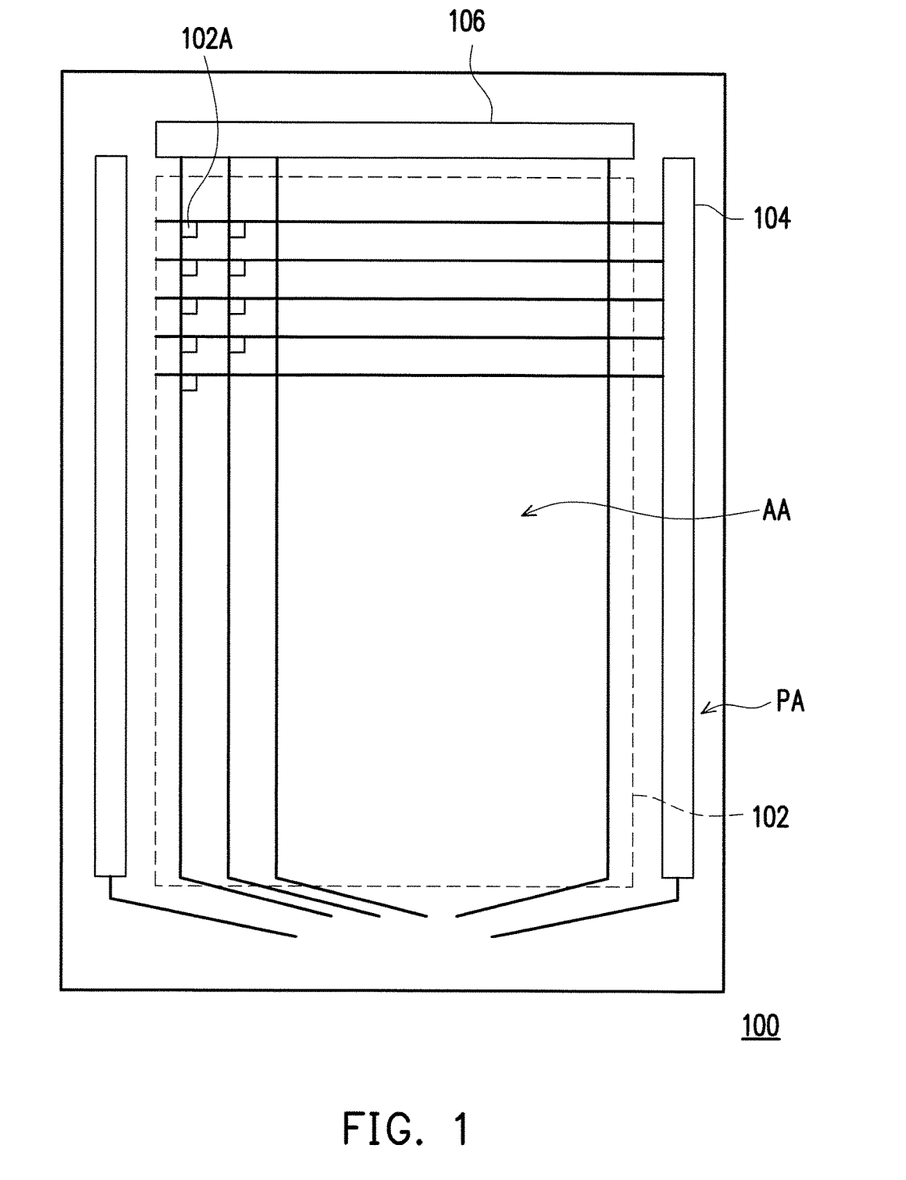
FIG. 1 is a top view of an active device array substrate according to an embodiment of the invention.

FIG. 1 is a top view of an active device array substrate according to an embodiment of the invention. In FIG. 1, the active device array substrate 100 has a display area AA and a peripheral area PA, where the display area AA generally occupies most of the area of the active device array substrate 100, and the peripheral area PA refers to a region encircling the display area AA and between an edge of the display area AA and an edge of the active device array substrate 100. The display area AA of the active device array substrate 100 is generally configured with a display area circuit 102 to implement functions to be achieved by the active device array substrate 100. The display area circuit 102 may include a plurality of pixel structures 102A arranged in an array. When the active device array substrate 100 is applied to a display panel, the pixel structures 102A may be used for driving a display medium of the display panel for displaying images. Meanwhile, the peripheral area PA of the active device array substrate 100 is selectively configured with peripheral area circuits 104 and 106, where the peripheral area circuit 104 may be a driving circuit of the pixel structures 102A, and the peripheral area circuit 106 may be an electro-static discharge (ESD) protection circuit, though the invention is not limited thereto.

Each of the pixel structures 102A generally includes at least one active device, and includes a pixel electrode, where the pixel electrode may be electrically connected to the active device. After the active device provides a display signal to the pixel electrode, a display medium is driven by the pixel electrode to display an image. Meanwhile, the peripheral area circuits 104 and 106 respectively include a plurality of active devices, so as to implement a required circuit design through serial and/or parallel connections of the active devices. Therefore, the active device array substrate 100 includes a plurality of the active devices, and the active devices located in different areas may be used for providing different functions.

Figure 2:
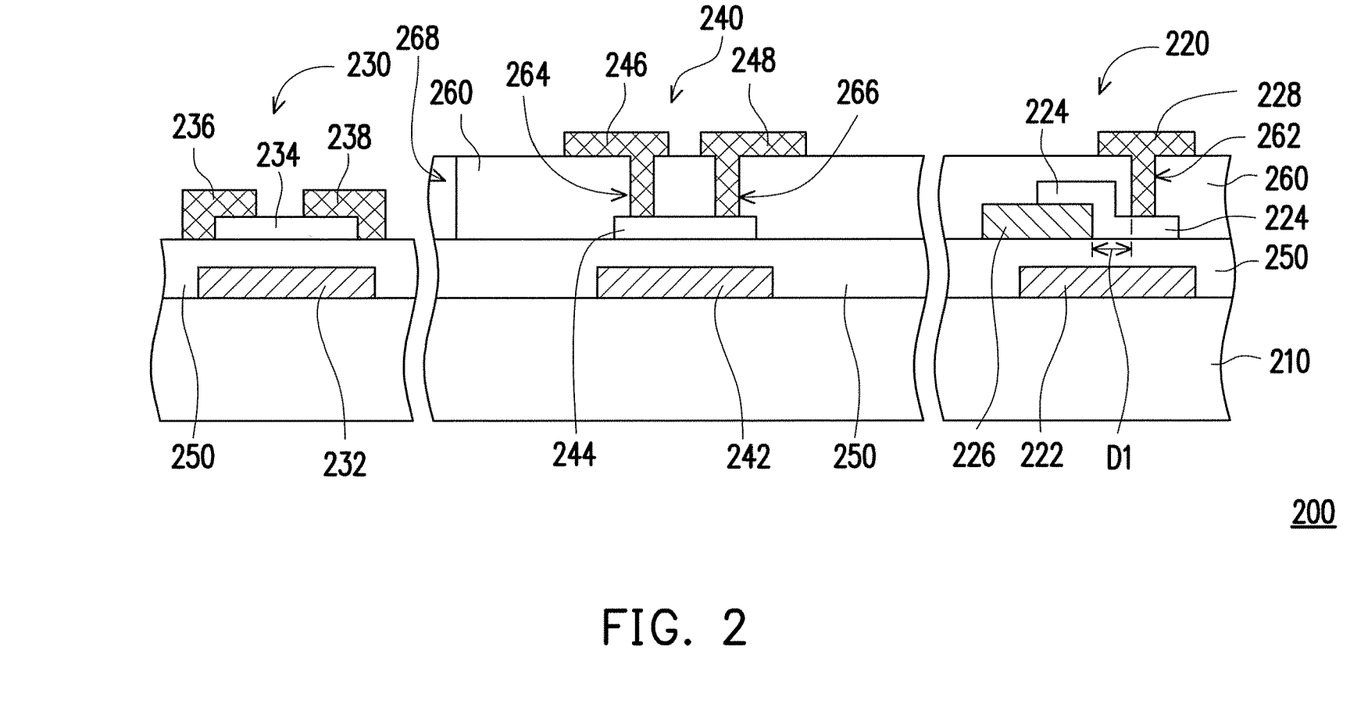
FIG. 2 is a cross-sectional view of an active device array substrate according to an embodiment of the invention.

In the present embodiment, the different active devices on the active device array substrate 100 may adopt different structures for implementation. For example, FIG. 2 is a cross-sectional view of an active device array substrate according to an embodiment of the invention. In FIG. 2, the active device array substrate 200 includes a substrate 210, a first active device 220, a second active device 230, a third active device 240, a gate insulation layer 250 and an insulation barrier layer 260. The first active device 220, the second active device 230 and the third active device 240 are disposed on the substrate 210 in parallel. The gate insulation layer 250 and the insulation barrier layer 260 are disposed on the substrate 210, and the insulation barrier layer 260 is disposed on the gate insulation layer 250. The gate insulation layer 250 and the insulation barrier layer 260 are used for separating the members or parts of the first active device 220, the second active device 230 and the third active device 240 that are not electrically connected, and protect the covered members or parts.

The first active device 220 includes a first gate electrode 222, a first semiconductor block 224, a first source electrode 226 and a first drain electrode 228. The first gate electrode 222 is located between the gate insulation layer 250 and the substrate 210, and the gate insulation layer 250 is located between the first gate electrode 222 and the first semiconductor block 224. The first source electrode 226 and the first drain electrode 228 contact the first semiconductor block 224 and separate from each other. In the present embodiment, the first source electrode 226 and the first drain electrode 228 contact different surfaces of the first semiconductor block 224. To be specific, the first source electrode 226 is disposed between the first semiconductor block 224 and the gate insulation layer 250 and contacts a lower surface of the first semiconductor block 224, and the lower surface is close to the gate insulation layer 250. The first source electrode 226 is located between the gate insulation layer 250 and the insulation barrier layer 260. The first drain electrode 228 is disposed on the insulation barrier layer 260, and the insulation barrier layer 260 has a first through hole 262, such that the first drain electrode 228 passes through the first through hole 262 to contact the first semiconductor block 224. In this way, the first drain electrode 228 contacts an upper surface of the first semiconductor block 224, and the upper surface is away from the gate insulation layer 250 and the substrate 210, and is close to the insulation barrier layer 260. Generally, configuration positions of the first source electrode 226 and the first drain electrode 228 may be exchanged. Therefore, in other embodiments, the first source electrode 226 may contact the first semiconductor block 224 through the first through hole 262, and the first drain electrode 228 is located between the gate insulation layer 250 and the insulation barrier layer 260.

The second active device 230 includes a second gate electrode 232, a second semiconductor block 234, a second source electrode 236 and a second drain electrode 238. The second gate electrode 232 is located between the gate insulation layer 250 and the substrate 210, and the gate insulation layer 250 is located between the second gate electrode 232 and the second semiconductor block 234. The second source electrode 236 and the second drain electrode 238 contact the second semiconductor block 234 and separate from each other. In the present embodiment, the insulation barrier layer 260 does not cover and reveals the second semiconductor block 234, the second source electrode 236 and the second drain electrode 238. The second source electrode 236 and the second drain electrode 238 directly contact the second semiconductor block 234 and are located on a same surface of the second semiconductor block 234. The insulation barrier layer 260 has an opening 268, and the opening 268 exposes the second active device 230.

The third active device 240 includes a third gate electrode 242, a third semiconductor block 244, a third source electrode 246 and a third drain electrode 248. The third gate electrode 242 is located between the gate insulation layer 250 and the substrate 210, and the gate insulation layer 250 is located between the third gate electrode 242 and the third semiconductor block 244. The third source electrode 246 and the third drain electrode 248 contact the third semiconductor block 244 and separate from each other. In the present embodiment, the insulation barrier layer 260 covers the third semiconductor block 244. The third source electrode 246 and the third drain electrode 248 are disposed on an upper surface of the insulation barrier layer 260, where the upper surface is away from the substrate 210. The insulation barrier layer 260 has a second through hole 264 and a third through hole 266, such that the third source electrode 246 and the third drain electrode 248 respectively contact the third semiconductor block 244 through the second through hole 264 and the third through hole 266.

In the present embodiment, the second source electrode 236 and the second drain electrode 238 may be formed by a same film layer, and the film layer of the second source electrode 236 and the second drain electrode 238 may be the same as that of the first source electrode 226 or the first drain electrode 228. Meanwhile, the third source electrode 246 and the third drain electrode 248 may also be formed by a same film layer, and the film layer of the third source electrode 246 and the third drain electrode 248 is the same as that of the first drain electrode 228. Therefore, although the first active device 220, the second active device 230 and the third active device 240 of different structures are configured on the same active device array substrate 200, it is unnecessary to use complex fabrication steps and a variety of film layers to produce the active devices. In other embodiments, the different active devices on the same active device array substrate may be implemented by using the first active device 220 in collaboration with at least one of the second active device 230 and the third active device 240. Namely, in some embodiments, the first active device 220 and the second active device 230 may be adopted on the same active device array substrate to implement the required circuit; and in other embodiments, the first active device 220 and the third active device 240 may be adopted on the same active device array substrate to implement the required circuit.

Figure 3:
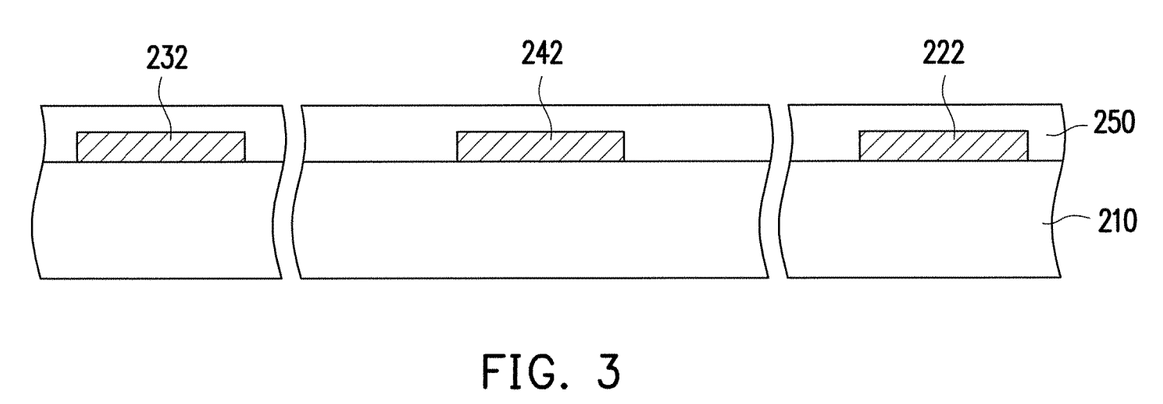
FIG. 3 to FIG. 6 are schematic diagrams of a manufacturing method of an active device array substrate.

A manufacturing method of the active device array substrate 200 is described below with reference of FIG. 3 to FIG. 6. As shown in FIG. 3, the first gate electrode 222, the second gate electrode 232 and the third gate electrode 242 are fabricated on the substrate 210, and the gate insulation layer 250 is fabricated on the substrate 210 to cover the first gate electrode 222, the second gate electrode 232 and the third gate electrode 242. To be specific, a conductive layer may be formed on the substrate 210, and then a patterning process is performed to pattern the conductive layer on the substrate 210 to form the first gate electrode 222, the second gate electrode 232 and the third gate electrode 242. Therefore, the first gate electrode 222, the second gate electrode 232 and the third gate electrode 242 are formed by the same film layer. The first gate electrode 222, the second gate electrode 232 and the third gate electrode 242 are made of a conductive material including Mo, W, Al, Ti or an alloy system containing any of the above materials, though the invention is not limited thereto. A material of the gate insulation layer 250 may be an insulation material such as an oxide, a nitride, an oxynitride, etc., such as silicon oxide, silicon nitride, silicon oxynitride, etc.

Figure 4:
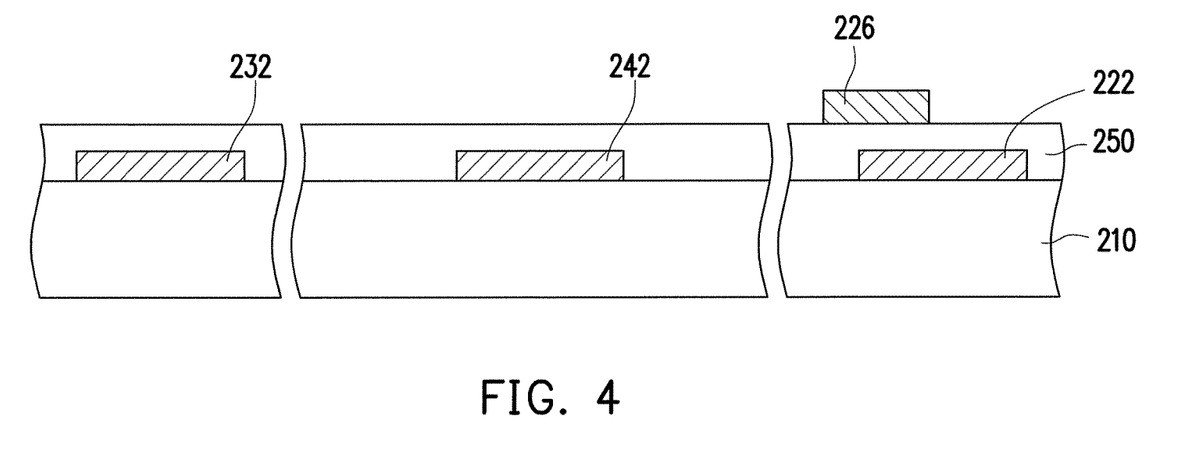
Figure 5:
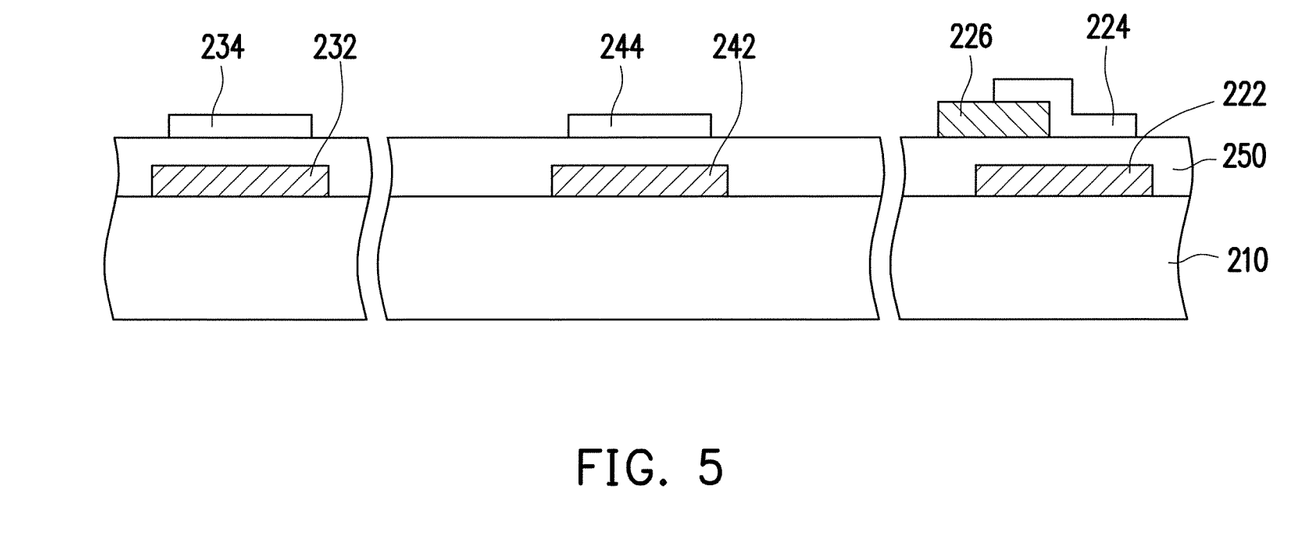

Then, referring to FIG. 4, the first source electrode 226 is formed on the gate insulation layer 250. A position of the first source electrode 226 corresponds to the first gate electrode 222, such that the first source electrode 226 and the first gate electrode 222 may commonly construct the subsequently completed active device. A material of the first source electrode 226 may include Mo, W, Al, Ti, or an alloy system containing any of the above materials, though the invention is not limited thereto. Then, referring to FIG. 5, after the first source electrode 226 is formed, the first semiconductor block 224, the second semiconductor block 234 and the third semiconductor block 244 are formed on the gate insulation layer 250. The first semiconductor block 224, the second semiconductor block 234 and the third semiconductor block 244 are respectively located on the tops of the first gate electrode 222, the second gate electrode 232 and the third gate electrode 242, and are overlapped with the first gate electrode 222, the second gate electrode 232 and the third gate electrode 242 in a thickness direction. Moreover, the first semiconductor block 224 partially covers the first source electrode 226, and the first source electrode 226 contacts a lower surface of the first semiconductor block 224, where the lower surface is adjacent to the gate insulation layer 250. In the present embodiment, the first semiconductor block 224, the second semiconductor block 234 and the third semiconductor block 244 may be formed by patterning a same semiconductor material layer. A material of the semiconductor material layer includes an oxide semiconductor material, but an amorphous silicon material, a polycrystalline silicon material, an organic semiconductor material or other semiconductor materials capable of being patterned into blocks according to a design requirement may also be applied.

Figure 6:
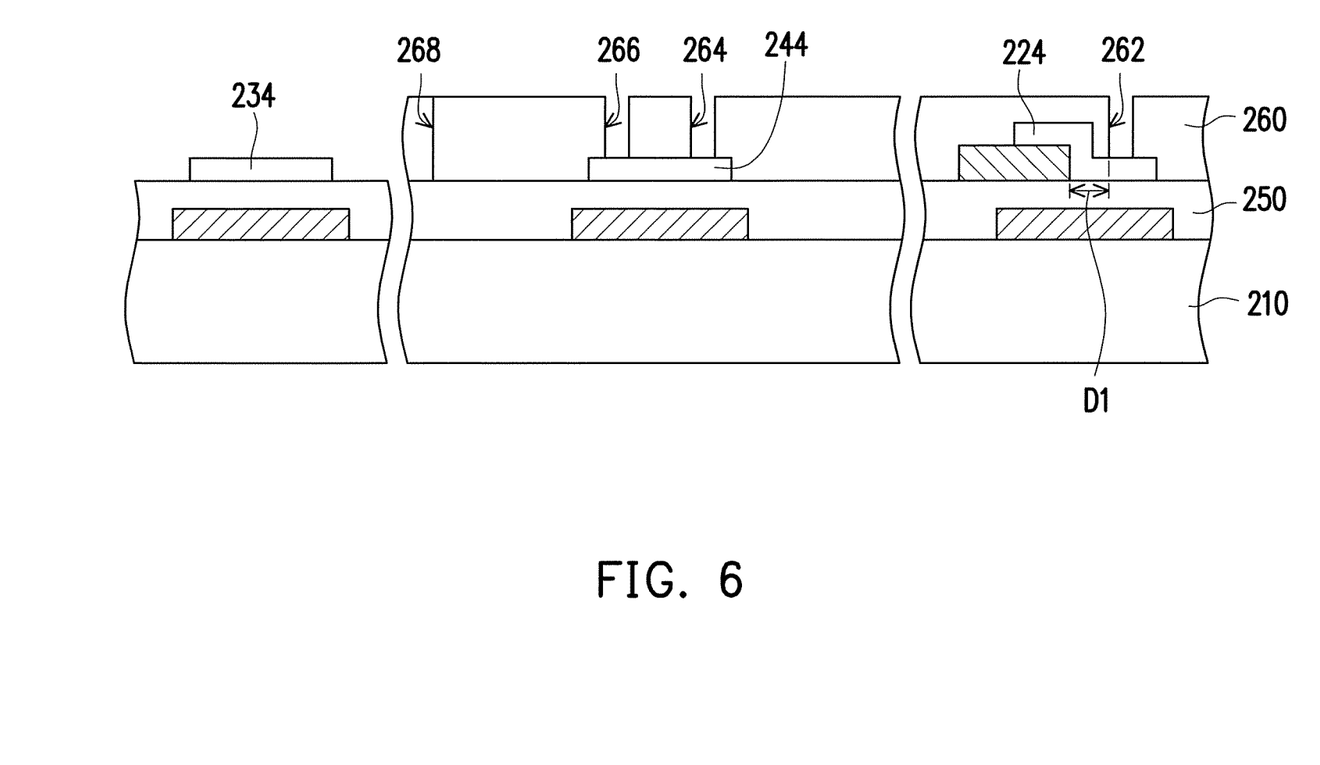

Then, referring to FIG. 6, the insulation barrier layer 260 is formed on the gate insulation layer 250. A material of the insulation barrier layer 260 may be the same as that of the gate insulation layer 250 or different from that of the gate insulation layer 250. The insulation barrier layer 260 covers the first source electrode 226, and is patterned to have the first through hole 262, the second through hole 264, the third through hole 266 and the opening 268. The so-called "through hole" refers to a structure with a larger height-diameter ratio, and "opening" refers to a structure with a smaller height-diameter ratio. According to FIG. 6, it is known that the first through hole 262 exposes a part of the first semiconductor block 224, the second through hole 264 and the third through hole 266 expose two parts of the third semiconductor block 244, and the opening 268 completely exposes the second semiconductor block 234. Meanwhile, the two parts of the third semiconductor block 244 exposed by the second through hole 264 and the third through hole 266 are not overlapped to each other. After the manufacturing step of FIG. 6, the first drain electrode 228, the second source electrode 236, the second drain electrode 238, the third source electrode 246 and the third drain electrode 248 are further formed, so that the active device array substrate 200 of FIG. 2 is formed.

In the present embodiment, the first drain electrode 228, the second source electrode 236, the second drain electrode 238, the third source electrode 246 and the third drain electrode 248 may be formed by patterning a same conductive material layer. Namely, after the step of FIG. 6, a conductive material layer may be formed on the substrate 210. Now, the conductive material layer may cover the insulation barrier layer 260 and is filled into the first through hole 262, the second through hole 264, the third through hole 266 and the opening 268. Then, the conductive material layer may be patterned by using a photolithography method, so as to form the first drain electrode 228 at the first through hole 262, form the third source electrode 246 at the second through hole 264, form the third drain electrode 248 at the third through hole 266 and form the second source electrode 236 and the second drain electrode 238 on the second semiconductor block 234 exposed by the opening 268. In this way, fabrication of the first active device 220, the second active device 230 and the third active device 240 is completed.

When the conductive material layer is patterned to construct the first drain electrode 228, the second source electrode 236, the second drain electrode 238, the third source electrode 246 and the third drain electrode 248, the first semiconductor block 224 and the third semiconductor block 244 are covered by the insulation barrier layer 260 to avoid being damaged in such step. Therefore, the structure design of the first active device 220 and the third active device 240 may ensure stability of the semiconductor material. When the first semiconductor block 224, the second semiconductor block 234 and the third semiconductor block 244 are made of the oxide semiconductor material, the first active device 220 and the third active device 240 may have good device stability. According to the above manufacturing steps, it is known that the second source electrode 236 and the second drain electrode 238 of the second active device 230 are formed by the same film layer, the third source electrode 246 and the third drain electrode 248 of the third active device 240 are formed by the same film layer, and the above components and the first drain electrode 228 of the first active device 220 are all formed by the same film layer. Therefore, although the first active device 220, the second active device 230 and the third active device 240 have different structures, it is unnecessary to implement complex process steps or a variety of film layers to produce the active devices, which avails decreasing a process burden and cost.

A channel size of the first active device 220 is related to a distance D1 between a part of the first semiconductor block 224 contacting the first source electrode 226 and a part of the first semiconductor block 224 contacting the first drain electrode 228. Since the first source electrode 226 and the first drain electrode 228 are produced by using different manufacturing steps, the distance D1 may be adjusted according to an actual requirement, so as to achieve the required channel size. The second active device 230 has a simplified structure design and a high carrier mobility, which reduces layout complexity of the components. The third active device 240 has better stability due to that the third semiconductor block 244 is not easy to be damaged during the manufacturing process. Therefore, the first active device 220, the second active device 230 and the third active device 240 in the active device array substrate 200 may be configured in different circuits according to their respective characteristics, so as to achieve optimal performance.

Figure 7:
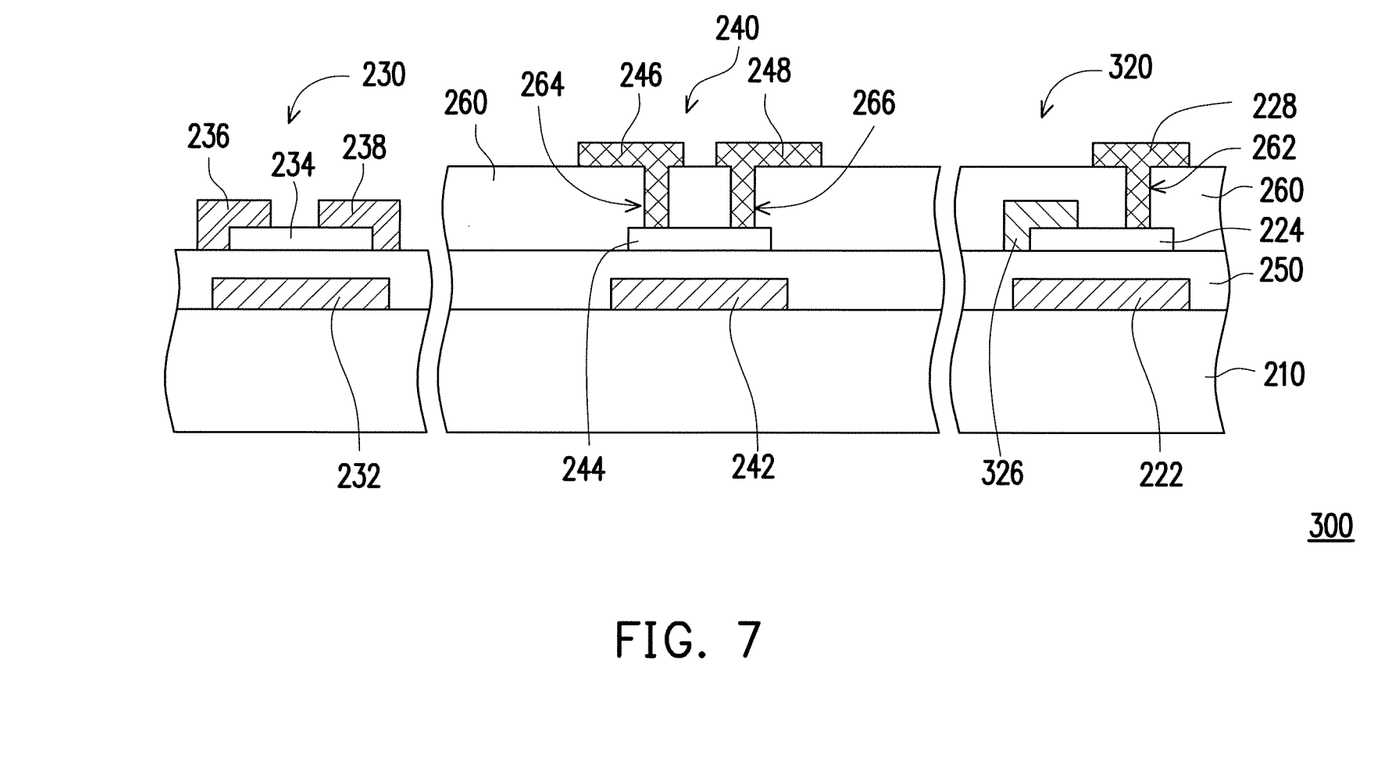
FIG. 7 is a cross-sectional view of an active device array substrate according to another embodiment of the invention.

FIG. 7 is a cross-sectional view of an active device array substrate according to another embodiment of the invention. In the FIG. 7, the active device array substrate 300 is substantially similar to the aforementioned active device array substrate 200, and a main difference therebetween lies in the structure of the first active device. To be specific, the active device array substrate 300 includes a first active device 320, the second active device 230, the third active device 240, the gate insulation layer 250 and the insulation barrier layer 260 disposed on the substrate 210. The structures and configuration relationships of the substrate 210, the second active device 230, the third active device 240, the gate insulation layer 250 and the insulation barrier layer 260 are substantially the same as or similar to those of the substrate 210, the second active device 230, the third active device 240, the gate insulation layer 250 and the insulation barrier layer 260 of the active device array substrate 200 depicted in FIG. 2, and details thereof are not repeated. The first active device 320 of the present embodiment includes the first gate electrode 222, the first semiconductor block 224, a first source electrode 326 and the first drain electrode 228. The first gate electrode 222 is located between the gate insulation layer 250 and the substrate 210, and the gate insulation layer 250 is located between the first gate electrode 222 and the first semiconductor block 224. The first source electrode 326 and the first drain electrode 228 contact the first semiconductor block 224 and separate from each other. To be specific, the first source electrode 326 is disposed between the first semiconductor block 224 and the insulation barrier layer 260, and the first source electrode 326 and the first drain electrode 228 contact a same surface of the first semiconductor block 224. Namely, a main difference between the present embodiment and the embodiment of FIG. 2 lies in a manufacturing sequence of the first source electrode 326 and the first semiconductor block 224, and in the embodiment of FIG. 2, the first source electrode 226 is produced earlier than the first semiconductor block 224, and in the present embodiment, the first source electrode 326 is produced later than the first semiconductor block 224. Namely, the first semiconductor block 224 is formed on the gate insulation layer 250 before the first source electrode 326 is formed.

For example, if the first active device 220/320, the second active device 230 and the third active device 240 are applied to the active device array substrate 100 of FIG. 1, the first active device 220/320 may be disposed in the display area circuit 102, the second active device 230 is disposed in the peripheral area circuit 106, and the third active device 240 is disposed in the peripheral area circuit 104, though the invention is not limited thereto. In other embodiments, the display area circuit 102 may be implemented by at least two of the first active device 220/320, the second active device 230 and the third active device 240. Moreover, at least two of the first active device 220/320, the second active device 230 and the third active device 240 on the same substrate 210 are electrically connected to construct the required circuit.

Figure 8:
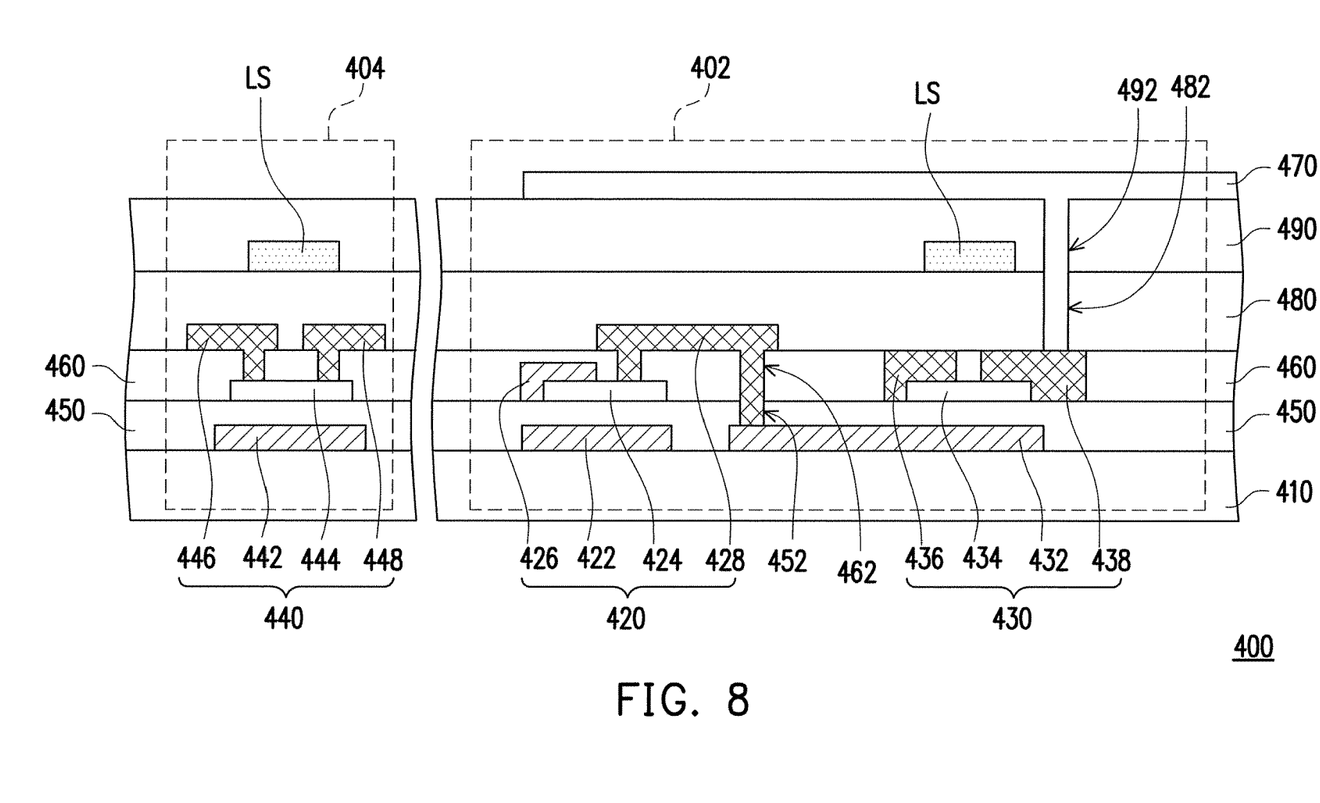
FIG. 8 is a cross-sectional view of an active device array substrate according to still another embodiment of the invention.

For example, FIG. 8 is a cross-sectional view of an active device array substrate according to still another embodiment of the invention. In FIG. 8, the active device array substrate 400 has a display area circuit 402 and a peripheral area circuit 404. To be specific, the active device array substrate 400 includes a substrate 410, a first active device 420, a second active device 430, a third active device 440, a gate insulation layer 450 and an insulation barrier layer 460. Structure designs of the substrate 410, the first active device 420, the second active device 430, the third active device 440, the gate insulation layer 450 and the insulation barrier layer 460 may be substantially the same as or similar to those of the substrate 210, the first active device 220/320, the second active device 230, the third active device 240, the gate insulation layer 250 and the insulation barrier layer 260 of the aforementioned embodiments. The first active device 420 and the second active device 430 are connected to each other to construct the display area circuit 402. The active device array substrate 400 further includes a pixel electrode 470 in the display area circuit 402, and the pixel electrode 470 is connected to the second active device 430. The third active device 440 is a component of the peripheral area circuit 404.

In the present embodiment, the first active device 420 includes a first gate electrode 422, a first semiconductor block 424, a first source electrode 426 and a first drain electrode 428. The first gate electrode 422 is located between the gate insulation layer 450 and the substrate 410, and the gate insulation layer 450 is located between the first gate electrode 422 and the first semiconductor block 424. The first source electrode 426 and the first drain electrode 428 contact the first semiconductor block 424 and separate from each other. The second active device 430 includes a second gate electrode 432, a second semiconductor block 434, a second source electrode 436 and a second drain electrode 438. The second gate electrode 432 is located between the gate insulation layer 450 and the substrate 410, and the gate insulation layer 450 is located between the second gate electrode 432 and the second semiconductor block 434. The second source electrode 436 and the second drain electrode 438 contact the second semiconductor block 434 and separate from each other. The third active device 440 includes a third gate electrode 442, a third semiconductor block 444, a third source electrode 446 and a third drain electrode 448. The third gate electrode 442 is located between the gate insulation layer 450 and the substrate 410, and the gate insulation layer 450 is located between the third gate electrode 442 and the third semiconductor block 444. The third source electrode 446 and the third drain electrode 448 contact the third semiconductor block 444 and separate from each other. The structure of the first active device 420 is similar to the structure of the first active device 220 of FIG. 2, the structure of the second active device 430 is similar to the structure of the second active device 230 of FIG. 2, and the structure of the third active device 440 is similar to the structure of the third active device 240 of FIG. 2, so that a manufacturing method of the first active device 420, the second active device 430 and the third active device 440 may refer to related description of the aforementioned embodiment.

The active device array substrate 400 further includes a passivation layer 480 and a planarization layer 490, where the passivation layer 480 covers the first active device 420, the second active device 430 and the third active device 440, and the planarization layer 490 is disposed on the passivation layer 480. The pixel electrode 470 is disposed on the planarization layer 490 and contacts the second drain electrode 438 of the second active device 430 through a through hole 482 in the passivation layer 480 and a through hole 492 in the planarization layer 490. Moreover, the first drain electrode 428 of the first active device 420 may be electrically connected to the second gate electrode 432 of the second active device 420 to implement the required driving circuit. Now, the first drain electrode 428 may contact the second gate electrode 432 through a through hole 462 in the insulation barrier layer 460 and a through hole 452 in the gate insulation layer 450.

Figure 9:
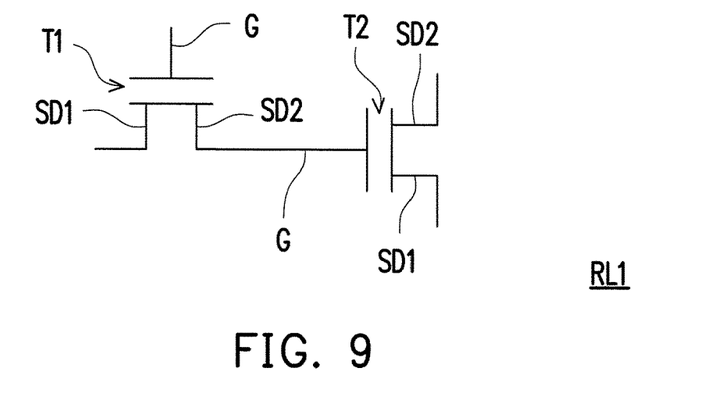
FIG. 9 to FIG. 11 are schematic diagrams of circuit layouts according to an embodiment of the invention.
Figure 10:
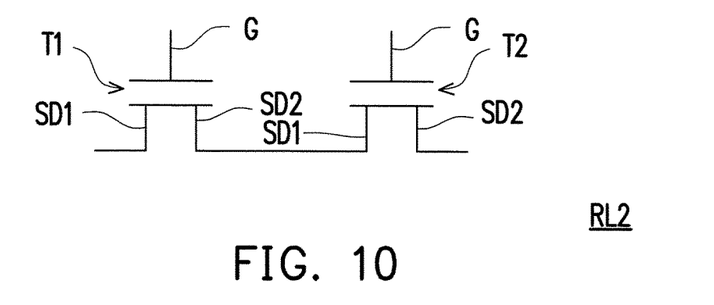
Figure 11:
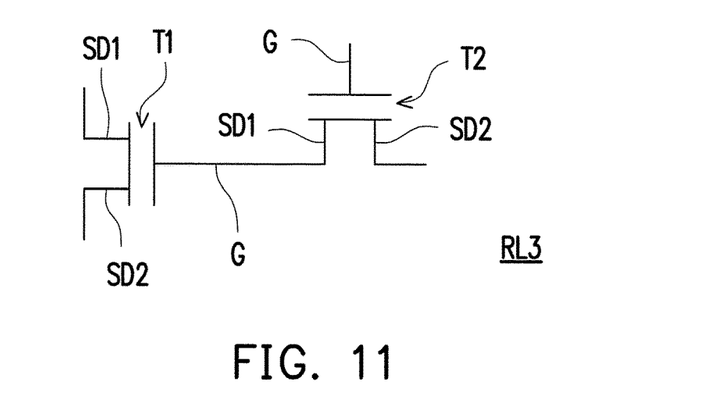

In order to implement the required circuit design, one of the first source electrode 426 and the first drain electrode 428 may be connected to one of the second gate electrode 432, the second source electrode 436 and the second drain electrode 438, or the first gate electrode 422 may be connected to one of the second source electrode 436 and the second drain electrode 438. For example, circuit layouts RL1-RL3 of FIG. 9 to FIG. 11 may be implemented by using the above structure designs. Specifically, the first active device T1 includes a first electrode G, a second electrode SD1 and a third electrode SD2, where the first electrode G is a gate electrode, and one of the second electrode SD1 and the third electrode SD2 is a source electrode and the other one is a drain electrode. The second active device T2 includes a first electrode G, a second electrode SD1 and a third electrode SD2, where the first electrode G is a gate electrode, and one of the second electrode SD1 and the third electrode SD2 is a source electrode and the other one is a drain electrode. In the circuit layout RL1, the third electrode SD2 (which may be the source electrode or the drain electrode) of the first active device T1 is connected to the first electrode G (the gate electrode) of the second active device T2. In the circuit layout RL2, the third electrode SD2 (which may be the source electrode or the drain electrode) of the first active device T1 is connected to the second electrode SD1 (which may be the source electrode or the drain electrode) of the second active device T2. In the circuit layout RL3, the first electrode G (the gate electrode) of the active device T1 is connected to the second electrode SD1 (which may be the source electrode or the drain electrode) of the second active device T2. In the circuit layouts RL1-RL3, one of the first source electrode 426 and the first drain electrode 428 of the aforementioned embodiment may be connected to one of the second gate electrode 432, the second source electrode 436 and the second drain electrode 438, or the first gate electrode 422 of the aforementioned embodiment may be connected to one of the second source electrode 436 and the second drain electrode 438.

Referring to FIG. 8, the first source electrode 426 and the first drain electrode 428 of the first active device 420 are fabricated in different steps, so that a channel length of the first active device 420 may be easily adjusted according to the design requirement. A size of the second active device 430 is smaller and carrier mobility thereof is higher. Therefore, in the display area circuit 402, the first active device 420 may serve as a switch for turning on/off the pixels, and the second active device 430 may serve as a driving switch used for providing a driving signal to the pixel electrode 470. Moreover, the third active device 440 has a certain size and a stable device characteristic, so that the third active device 440 applied to the peripheral area circuit 404 may guarantee a circuit performance. However, the invention is not limited thereto.

Moreover, the active device array substrate 400 further includes a plurality of light shielding members LS disposed between the passivation layer 480 and the planarization layer 490, where one light shielding member LS is located above the second active device 430 to shield a light irradiating the second semiconductor block 434 from external, and another light shielding member LS is located above the third active device 440 to shield the light irradiating the third semiconductor block 444 from external. The light shielding member LS is selectively not disposed above first active device 420, though an area of the first drain electrode 428 may be extended to the top of the first semiconductor block 424 to shield the light irradiating the first semiconductor block 424 from external. In other embodiments, the planarization layer 490 and the light shielding members LS may be selectively omitted.

In summary, the active device array substrate of the invention adopts the active devices with various different structures, such that a designer may select different active devices according to different requirements, by which design flexibility is improved and optimization of the active device array substrate is achieved. Moreover, although different active devices have different structures, the manufacturing methods thereof are compatible, so that the active devices with different structures may be fabricated on the same active device array substrate under the premise that no additional film layer is added.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An active device array substrate, comprising:
   a substrate;
   a first active device, disposed on the substrate and comprising a first gate electrode, a first semiconductor block, a first source electrode and a first drain electrode, wherein the first source electrode and the first drain electrode contact the first semiconductor block and are separate from each other;
   a second active device, disposed on the substrate and comprising a second gate electrode, a second semiconductor block, a second source electrode and a second drain electrode, wherein the second source electrode and the second drain electrode contact the second semiconductor block and are separate from each other, and a film layer of the second source electrode and the second drain electrode is the same with that of the first source electrode or the first drain electrode;
   a gate insulation layer, disposed on the substrate, wherein the first gate electrode and the second gate electrode are located between the gate insulation layer and the substrate, and the gate insulation layer is located between the first gate electrode and the first semiconductor block and is also located between the second gate electrode and the second semiconductor block; and
   an insulation barrier layer, disposed on the gate insulation layer, and covering the first semiconductor block, and the insulation barrier layer having a first through hole reaching a surface of the first semiconductor block, wherein the insulation barrier layer is disposed between the first source electrode and the first drain electrode and the insulation barrier layer reveals the second semiconductor block, the second source electrode and the second drain electrode, and wherein one of the first source electrode and the first drain electrode contacts the first semiconductor block through the first through hole and the other one is located between the gate insulation layer and the insulation barrier layer.

2. The active device array substrate as claimed in claim 1, further comprising:
   a third active device, disposed on the substrate and comprising a third gate electrode, a third semiconductor block, a third source electrode and a third drain electrode, wherein the gate insulation layer is further located between the third gate electrode and the third semiconductor block, the third source electrode and the third drain electrode contact the third semiconductor block and are separate from each other, and a film layer of the third source electrode and the third drain electrode is the same with that of the first source electrode or the first drain electrode.

3. The active device array substrate as claimed in claim 2, wherein the insulation barrier layer further covers the third semiconductor block, the insulation barrier layer has a second through hole and a third through hole, the third source electrode and the third drain electrode are disposed on an upper surface of the insulation barrier layer, the upper surface is away from the substrate, and the third source electrode and the third drain electrode respectively contact the third semiconductor block through the second through hole and the third through hole.

4. The active device array substrate as claimed in claim 1, wherein one of the first source electrode and the first drain electrode is connected to one of the second gate electrode, the second source electrode and the second drain electrode, or the first gate electrode is connected to one of the second source electrode and the second drain electrode.

5. The active device array substrate as claimed in claim 1, wherein a material of the first semiconductor block and the second semiconductor block comprises an oxide semiconductor material.

6. The active device array substrate as claimed in claim 1, wherein the first source electrode and the first drain electrode contact different surfaces of the first semiconductor block.

7. The active device array substrate as claimed in claim 1, wherein the first source electrode and the first drain electrode contact a same surface of the first semiconductor block.

8. The active device array substrate as claimed in claim 1, further comprising:
a plurality of pixel electrodes, arranged in a display area in an array, wherein one of the first active device and the second active device is disposed in the display area and is connected to one of the pixel electrodes, and the other one of the first active device and the second active device is disposed in a peripheral area, and the peripheral area is located at a periphery of the display area.

9. An active device array substrate, comprising:
a substrate;
a first active device, disposed on the substrate and comprising a first gate electrode, a first semiconductor block, a first source electrode and a first drain electrode, wherein the first source electrode and the first drain electrode contact the first semiconductor block and are separate from each other;
a second active device, disposed on the substrate and comprising a second gate electrode, a second semiconductor block, a second source electrode and a second drain electrode, wherein the second source electrode and the second drain electrode contact the second semiconductor block and are separate from each other, and a film layer of the second source electrode and the second drain electrode is the same with that of the first source electrode or the first drain electrode;
a gate insulation layer, disposed on the substrate, wherein the first gate electrode and the second gate electrode are located between the gate insulation layer and the substrate, and the gate insulation layer is located between the first gate electrode and the first semiconductor block and is also located between the second gate electrode and the second semiconductor block; and
an insulation barrier layer, disposed on the gate insulation layer, and covering the first semiconductor block, and the insulation bather layer having a first through hole reaching a surface of the first semiconductor block, wherein the insulation barrier layer is disposed between the first source electrode and the first drain electrode, one of the first source electrode and the first drain electrode contacts the first semiconductor block through the first through hole, and the other one is located between the gate insulation layer and the insulation barrier layer, and wherein the insulation barrier layer covers the second semiconductor block, and has a second through hole and a third through hole, the second source electrode and the second drain electrode are disposed on an upper surface of the insulation barrier layer, the upper surface is away from the substrate, and the second source electrode and the second drain electrode respectively contact the second semiconductor block through the second through hole and the third through hole.

10. A manufacturing method of an active device array substrate, comprising:
fabricating a first gate electrode, a second gate electrode, a third gate electrode and a gate insulation layer on a substrate, wherein the gate insulation layer covers the first gate electrode, the second gate electrode and the third gate electrode;
forming a first semiconductor block, a second semiconductor block and a third semiconductor block on the gate insulation layer, wherein a position of the first semiconductor block corresponds to the first gate electrode, a position of the second semiconductor block corresponds to the second gate electrode, and a position of the third semiconductor block corresponds to the third gate electrode;
forming a first source electrode on the gate insulation layer, wherein the first source electrode contacts the first semiconductor block;
forming an insulation barrier layer on the gate insulation layer, wherein the insulation barrier layer covers the first source electrode, and is patterned to have a first through hole, a second through hole, a third through hole and an opening, wherein the first through hole exposes the first semiconductor block, the second through hole and the third through hole expose two parts of the third semiconductor block, and the opening completely exposes the second semiconductor block; and
forming a first drain electrode, a second source electrode, a second drain electrode, a third source electrode and a third drain electrode, wherein the first drain electrode is filled in the first through hole, and the third source electrode and the third drain electrode are respectively filled in the second through hole and the third through hole, and the second source electrode and the second drain electrode are formed on the second semiconductor block exposed by the opening.

11. The manufacturing method of the active device array substrate as claimed in claim 10, wherein the first drain electrode, the second source electrode, the second drain electrode, the third source electrode and the third drain electrode are formed by patterning a same conductive material layer.

12. The manufacturing method of the active device array substrate as claimed in claim 10, wherein after the first source electrode is formed, the first semiconductor block is formed on the gate insulation layer.

13. The manufacturing method of the active device array substrate as claimed in claim 10, wherein before the first source electrode is formed, the first semiconductor block is formed on the gate insulation layer.

14. The manufacturing method of the active device array substrate as claimed in claim 10, wherein the first semiconductor block, the second semiconductor block and the third semiconductor block are formed by patterning a same semiconductor material layer.

* * * * *